US006646291B2

(12) United States Patent
Takagi

(10) Patent No.: US 6,646,291 B2
(45) Date of Patent: Nov. 11, 2003

(54) ADVANCED OPTICAL MODULE WHICH ENABLES A SURFACE MOUNT CONFIGURATION

(75) Inventor: Toshio Takagi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/217,344

(22) Filed: Aug. 13, 2002

(65) Prior Publication Data
US 2003/0034498 A1 Feb. 20, 2003

(30) Foreign Application Priority Data
Aug. 14, 2001 (JP) ......................... 2001-246182

(51) Int. Cl.[7] .......................... H01L 23/00; H01L 23/02
(52) U.S. Cl. ......................... 257/99; 257/98; 257/100; 257/103; 257/678; 257/101; 257/99; 257/80; 385/88; 385/31
(58) Field of Search .............................. 372/50; 257/88, 257/89, 91, 92, 95, 99, 103, 101, 678, 80, 81, 98, 100, 432, 433; 385/88, 31, 93, 89, 92, 91, 94; 362/555, 375, 800

(56) References Cited

U.S. PATENT DOCUMENTS 6,207,950 B1    3/2001  Verdiell ................... 250/239
6,227,724 B1    5/2001  Verdiell ................... 385/91
6,331,992 B1 * 12/2001  Gilliland et al. ............ 372/50
6,404,042 B1 *  6/2002  Sone et al. ................ 257/678

OTHER PUBLICATIONS

English translation of the abstract of Japanese Patent Application Laid–Open No. 11–119062, Publication Date: Apr. 30, 1999.

English translation of the abstract of Japanese Patent Application Laid–Open No. 06–273640, Publication Date: Sep. 30, 1994.

* cited by examiner

Primary Examiner—Minh Loan Tran
Assistant Examiner—Tan Tran
(74) Attorney, Agent, or Firm—Smith, Gambrell & Russell, LLP

(57) ABSTRACT

The optical module 10 of the present invention comprises a semiconductor optical device 14, a package 12 containing the semiconductor device, and lead terminals 22. The package 12 comprises a bottom member 34 and a side member 36. The bottom member contains a device mounting surface S2, the side member mounting surface S3, and a lead terminal joining surface S1. The optical semiconductor device 14 is mounted on the device mounting surface S2 and lead terminals are joined to the lead terminal joining surface S1.

17 Claims, 2 Drawing Sheets

ADVANCED OPTICAL MODULE WHICH ENABLES A SURFACE MOUNT CONFIGURATION

BACKGROUND OF THE INVENTION

1. Field of the Invention

This invention relates to a light emitting module and the method of the producing the module.

2. Related Prior Art

A typical light emitting module comprises a light emitting semiconductor device such as a laser diode and a package containing the device therein. The package has a rectangle shape, which is called a butterfly package, and provides lead terminals. Electrical signals by which the semiconductor device is driven are lead through lead terminals.

In the conventional module, a sub-assembly in which the light emitting device and some optical members are assembled beforehand is installed into the butterfly package, a bottom member and a side member of the package are rigidly put together. It is necessary to secure an enough space to handle tools for installing the sub-assembly in the package and for electrically connecting between the sub-assembly and lead terminals, which is an obstacle to the small-sized module.

In the conventional package, lead terminals are fixed to the side member of the package; the level of lead terminals is the same as that of the light emitting device. When the module is surface mounted to the motherboard, the lead must be elongated to bend downwardly. The elongated lead coupled with the large package results on the longer path length from the lead terminal, the high frequency signal input thereon, to the light emitting device, which brings the deterioration of the high frequency performance of the module.

SUMMARY OF THE INVENTION

The object of the present invention is to provide an advanced optical module and the manufacturing method of the same, which enables a surface mount configuration without causing the inferiority of the high frequency performance.

To realize the object, the module according to the present invention comprises an optical semiconductor device, a package containing the emitting device therein, and lead-terminals. The package comprises a bottom member and a side member. The bottom member may have a device mounting surface, a side member mounting surface surrounding the device mount surface therearound, and a lead forming surface surrounding the side member mounting surface. The device mounting surface mounts the semiconductor device thereon, and the lead terminals contact the lead forming surface thereto.

In the present module, it is enable to bond the side member to the bottom member after mounting the semiconductor device on the device mount surface and electrically connecting the device to peripheral components. Therefore, the side member is not an obstacle in installing the semiconductor device and wiring the device to other devices. Hence, this leads a small sized package.

The configuration of lead terminal that attached to the bottom member of the package shorten the length of the terminal compared with the conventional configuration when the module is surface mounted on a motherboard. Moreover, the size of the module itself is to be small size as mentioned. Therefore, the path from the tip of the terminal, the high frequency signal input therein, to the semiconductor device is shortened, thus prevents the deterioration of the high frequency performance of the module.

It is favorable that the level of the device mounting surface be above that of the lead forming surface, because the alignment between the semiconductor device and an optical fiber, the optical signal transmits therethrough, is facilitated.

It is also favorable that the level of the side member mounting surface is between the lead forming surface and the device mounting surface. The attachment of the side member of the package to the bottom member is simple.

It is favorable to fix the side member to the bottom member after mounting the semiconductor device on the device mounting surface and performing the wire bonding the semiconductor device to the peripheral circuit. This assembling process makes it possible to eliminate the extra space within the package and to shrink the size of the package. The path length from the lead terminal, the high frequency signal input thereto, to the peripheral circuit is shortened, thus prevents the deterioration of the high frequency performance of the module.

DETAILED DESCRIPTION OF THE INVENTION

The favorable embodiments of the configuration and the manufacturing method of the optical module will be described in referring to drawings. In the description, elements identical to each other will be referred to with numerals identical to each other without their overlapping explanations.

Figure 1:
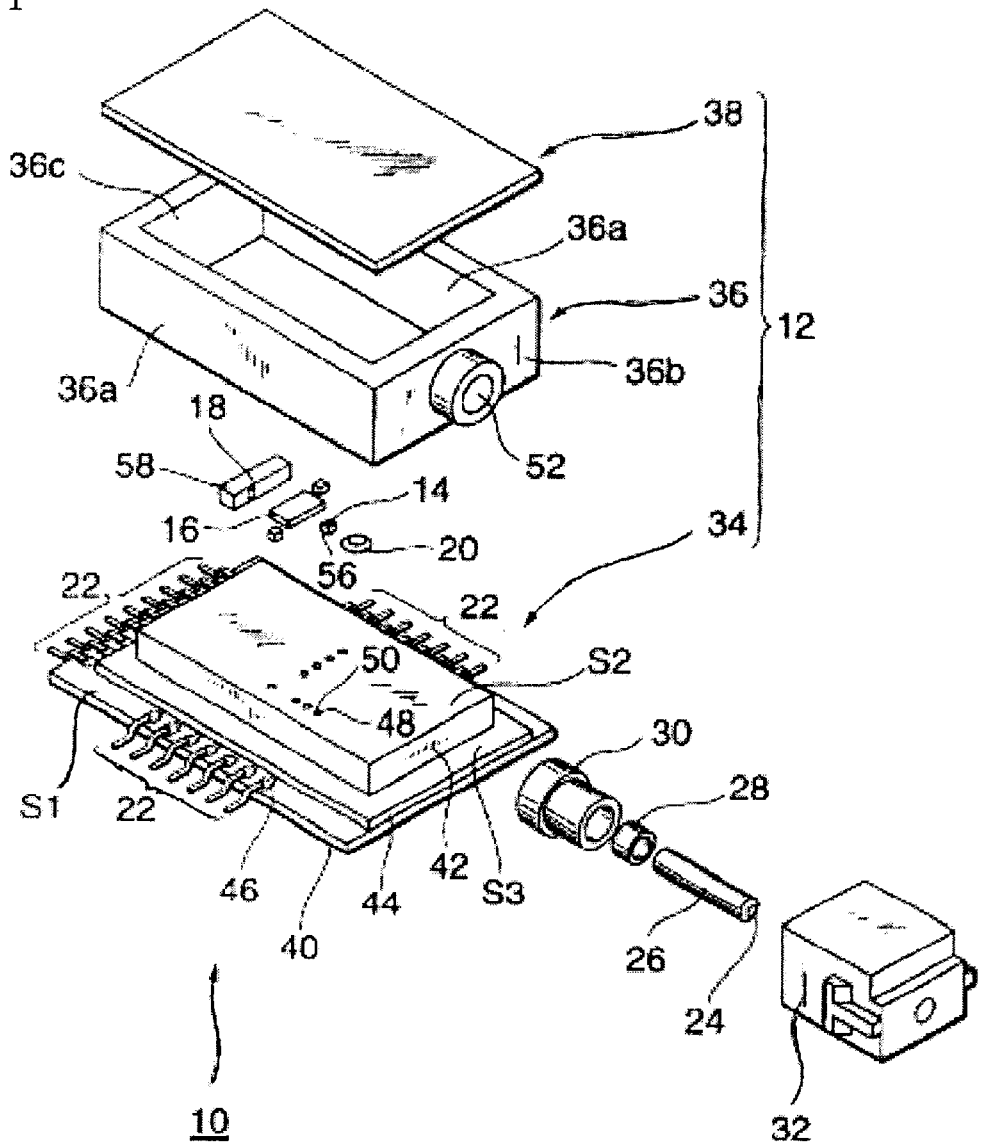
FIG. 1 is an exploded view of a module according to the present invention.
Figure 2:
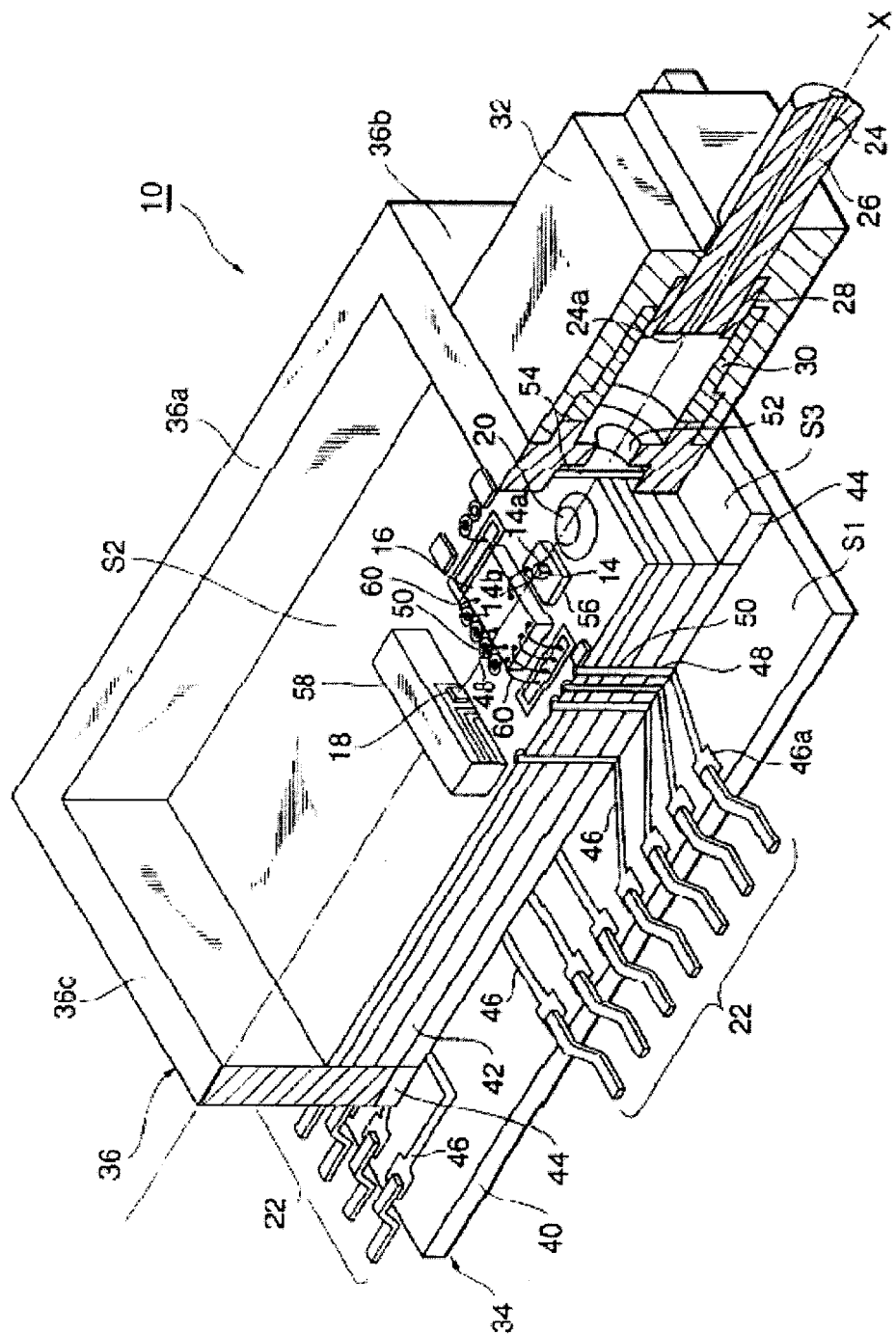
FIG. 2 is a partial cut away view of the module.

FIG. 1 is exploded view and FIG. 2 shows a partial cut away view of the present optical module. As shown in FIG. 1 and FIG. 2, the optical module 10 provides a package 12, an optical semiconductor device 14, a peripheral circuit 16 for the semiconductor device, a light receiving device 18, a lens 20, a plurality of lead terminals 22, a ferrule 26 for containing an optical fiber 24 therein, a sleeve 28 for inserting the ferrule 26 thereinto, a sleeve holder 30 for securing the sleeve 28 and a connector 32.

The package 12 comprises a bottom member 34, a side member 36 and a top member 38, respective members 34 to 38 are formed independently. The bottom member 34 provides a package substrate 40, a wiring substrate 42 arranged on the upper surface of the package substrate 40, and an insulating member 44 on the package substrate 40, the insulating member 44 surrounds the wiring substrate 42.

The package substrate 40 is made of a material with good a thermal conductivity and an insulating characteristic, the shape of which is rectangle and board form. Aluminum nitride is suitable for the package substrate. The upper surface of the package substrate 40 provides conductive wiring 46 thereon to conduct an electrical signal input into lead terminals 22 to the peripheral circuit 16. A peripheral portion surrounding the insulating member 44 on the upper surface of the package substrate 40 provides a lead forming surface S1.

The wiring substrate 42 is a multi-layered substrate, which lays thin films of insulating materials, such as Aluminum nitride and Aluminum ceramics. The substrate 42 is rectangle that is one size smaller than the package substrate 40.

The bottom surface of the wiring substrate 42 directly contacts with the upper surface of the package substrate 40. The upper surface of the wiring substrate 42 provides a device mounting surface S2, the semiconductor device 14 and the peripheral circuit 16 is mounted thereon. A plurality of via holes 48 is bored through the upper surface and the bottom surface of the wiring substrate in the neighbor of the device mounting surface S2. Conductive metals are plugged within via holes 48, which form conductive member 50. The conductive member 50 connects the conductive wiring 46.

The insulating member 44 is made of an Aluminum nitride (AlN) or Aluminum ceramics. The member 44 is mounted on the package substrate 40 and surrounds the wiring substrate 42 therein. The upper surface of the insulating member 44 provides a side member mounting surface S3; the side member 36 of the package 12 is placed thereon. In the present embodiment, the insulating member 44 and the wiring substrate 42 are independent to each other. It is favorable to form integrally the insulating member and the wiring substrate 42.

Thus forms the bottom member 34 of the package 12 by mounting the wiring substrate 42 and the insulating member 44 onto the package substrate 40. In such configuration of the bottom member 34, the upper surface of the wiring substrate 42 positions above the upper surface of the package substrate 40 containing the lead forming surface S1. The upper surface of the insulating member, which provides the side member mounting surface S3, positions between the upper surface of the package substrate 40 and the upper surface of the wiring substrate 42.

The side member 36 is made of a metal, such as Kovar. The side member comprises a pair of side walls 36a, which extends along an axis X shown in FIG. 2, a front end wall 36b and a back end wall 36c both intersecting the axis X. The front end wall 36b provides a bore 52 to pass light emitted from the semiconductor device 14. Within the bore, a glass sheet 54 is inserted to seal the package 12 hermetically. The side member 36 is mounted on the insulating member 44 in the state that the inner side of the side member 36 contacts the side surface of the wiring substrate 42.

The top member 38 is also made of metals, such as Kovar. The top member seals the opening of the side member 36.

The semiconductor device 14 is mounted on the upper surface of the wiring substrate 42 through a sub-mount 56. The device 14 has a light emitting surface 14a and a light reflecting surface 14b. The device 14 is driven by the peripheral circuit 16 and emits light modulated by a signal output from the driving circuit 14 from the light emitting surface 14a. It is favorable to use a semiconductor laser as the device 14. The peripheral circuit 16 is placed in a position opposing to the light reflecting surface of the device 14 and right close to the device 14 on the wiring substrate 42. The peripheral circuit 16 receives the signal input at lead terminals 22, amplifies the input signal and generates the driving signal of the semiconductor device 14. The driving signal is conducted to the semiconductor optical device 14.

The light receiving device 18 is fixed onto a side surface of a holder element 58 and the wiring substrate 42 mounts the holder element 58 thereon. The holder 58 is placed so as to insert the peripheral circuit 16 by the semiconductor device 14 therebetween. A light receiving surface of the light receiving device 18 is optically coupled to the light reflecting surface 14b of the semiconductor device 14. The light receiving device 18 monitors a light emitting behavior of the semiconductor device 14. A device to generate a photosensitive current, such as a PIN photo diode is favorable for the receiving device 18.

The lens 20 is mounted on the wiring substrate so as to insert the semiconductor device 14 by the peripheral circuit 16 therebetween. The lens is planed off to form a parallel surface of the top and the bottom portion of the ball lens. Since the bottom surface of the lens is level, it is enable to mount directly on the wiring substrate 42. The lens 20 is placed after aligning the optical axis as adhering the top surface of the lens 20 by the manipulator. In the case that the surface of the lens 20 is spherical, misplacement may occur when the lens 20 is fixed on the substrate 42. By shaping the top surface and the bottom surface of the lens 20 into level, the misplacement of the lens 20 can be evaded because it is enable to adhere the top surface of the lens 20 as keeping the bottom surface of the lens 20 and the top upper surface of the wiring substrate 42 in parallel.

The ferrule 26 is made of Zirconia ceramics and optical fiber 24 is inserted thereinto. The ferrule 26 is squeezed into the sleeve 28 made of metal. The holder 30 holds sleeve 28. The sleeve holder 30 is fixed on the outer surface of the front-end wall 36b of the side member at the location where the bore 52 is provided. The optical fiber 24 and the lens 20 are optical aligned to each other through the ferrule 26, the sleeve 28 and the sleeve holder 30. Therefore, the light emitting surface 14a of the semiconductor device 14 and a tip 24 of the fiber 24 are optically aligned through the lens 20.

As shown in FIG. 2, the optical fiber 24, the bore 52, the glass sheet 54, the lens 20, the semiconductor device 14, the peripheral circuit 16 and the light receiving device are aligned along the axis X in this order. The semiconductor device 14, the peripheral circuit 16, the lens 20 and the light receiving device 18 are air-tightly sealed within the package 12, while the optical fiber 24, the ferrule 26, the sleeve 28 and the sleeve holder 30 are fixed out of the package 12.

The connector 32 covers the ferrule 26, sleeve 28 and the sleeve holder 30 therein. The optical module 10 is able to couple to the another optical element through the connector 32.

Lead terminals 22 are fixed on the lead forming surface S1 surrounding the insulating member 44 on the package substrate 40. Lead terminals 22 are connected to bonding pads4 46 formed on the lead forming surface. Lead terminals 22 are bent downward to enable the surface mount on a motherboard (not shown in figures). By this configuration, a high frequency signal from the mother board is transmitted to the peripheral circuit 16 through lead terminals 22, the conductive wiring 46, the conducting member 50 within via holes 48 and bonding wires 60. Once transmitted signal to the peripheral circuit 16 is amplified and applied to the semiconductor device 14. The signal light modulated by thus applied to the semiconductor device 14 is emitted from the light emitting surface 14a. The light from the semiconductor device 14 is condensed by the lens 20, passing through the glass sheet 54 and the bore 52 in the side member 36 of the package 12, and enters into the optical fiber 24 through the tip 24a.

Next is an explanation of the manufacturing method of the optical module 10.

The first step of the assembling process is to place the wiring substrate 42 onto the upper surface of the package substrate 40. Meanwhile, it is aligned between the conductive wiring 46 on the upper surface of the package substrate 40 and the conductive member 50 within via hole 50 of the wiring substrate. Next, the insulating member 44 is placed in the periphery on the package substrate 40. In the case that the wiring substrate 42 and the insulating member are made from one body, it is enable to simplify the manufacturing process only by mounting the wiring substrate 42 onto the package substrate 40.

Next, lead terminals 22 bent downward are connected to bonding pads on the lead forming surface S1. It is able to fix lead terminals onto the surface S1 before placing the wiring substrate 42 onto the package substrate 40. By installing lead terminals at the early stage of the manufacturing, it will be able to couple the optical fiber 24 and the device 14 as operating the device 14.

After fixing the wiring substrate 42, the light receiving device 18, the peripheral circuit 16, the semiconductor device 14, and the lens 20 are mounted on the predetermined position of the wiring substrate 42. The semiconductor device 14 is mounted through the sub-mount 56. The light receiving device 18 is fixed onto the side surface of the holder 58, and the holder 58 is mount on the wiring substrate 42. Meanwhile, the receiving device 18, the peripheral circuit 16, the semiconductor device 14, and the lens 20 are aligned along the predetermined axis X in this order.

After then, the conductive member 50 within via holes 48 is connected to the peripheral circuit 16, and the peripheral circuit 16 is connected to the semiconductor device 14 by wiring, respectively.

Next, the side member 36 is installed onto the side member mounting surface S3 on the insulating member 44. The sleeve holder 30, the ferrule 26 is secured therein through the sleeve 28, is fixed to the position where the bore 52 is formed. In this step, the position of the sleeve holder is adjusted so as to couple optically the light emitting surface 14a of the semiconductor device 14 to the tip 24a of the optical fiber 24 through the lens 20. As explained previously, light from the semiconductor device 14 is practically entered into the tip 24a of the optical fiber 24 and monitors output light from the other tip of the fiber 24. The position of the sleeve holder 30 is adjusted so as to maximize the optical power monitored at the other end of the fiber 24. After fixing the sleeve holder 30, the connector 32 is attached to cover the sleeve holder 30, the sleeve 28 and the ferrule 26.

Finally, the opening of the side member 36 is sealed by the top member 38, which hermetically seals the optical model 10.

The optical module of the present embodiment, the package 12 is formed separately by the bottom member and the side member, which enables the fixing of the side member 36 to the bottom member 34 after mounting optical devices, such as the semiconductor device 14, in the device mounting surface S2 and wiring to devices mounted thereon. Therefore, the side member 36 is not an obstacle when optical elements, such as the semiconductor device 14, are mounted on the bottom member 34 and the wire bonding between such devices are performed, which removes the extra space within the package, hence results on the small-sized optical module.

Moreover, lead terminals 22 are connected on the lead forming surface S1 on the bottom member 34, which shorten the length of lead terminal at the surface mount configuration compared with the conventional configuration in which lead terminals are connected to the side member of the package. The length from the tip of the lead terminal, to which a high frequency driving signal is input, to the semiconductor device 14 is able to shorten. This prevents the deterioration of the high frequency performance of the module.

In the present optical module 10, since the device mounting surface S2 positions above the lead forming surface S1, the optical alignment of optical elements mounted in the surface S2 is simplified.

Furthermore, since the wiring substrate 42 provides plurality of via holes 48, the conducting member 50 is plugged therein to connect the conductive wiring in the package substrate to the driving circuit on the surface S2, it enables the path from the lead terminal 22 to the peripheral circuit 16 to be short.

The peripheral circuit 16 is mounted adjacent the semiconductor device 14 on the device mounting surface S2. This results on the improvement of the high frequency performance of the module.

From the invention thus described, it will be obvious that the invention may be varied in many ways. It is appropriate to vary the configuration of the module. One example is that the configuration of the present invention may be applicable to the light receiving module, although the specification describes mainly the light emitting module. A photo diode PD and a pre-amplifier circuit are used in the light receiving module as an optical semiconductor device 14 and a peripheral circuit 16, respectively. The lens 20 condenses light emitted from the tip of the optical fiber 24a to the light receiving surface of the PD 14.

Even in the receiving module, the configuration of the present package, in which the side member is independent of the bottom member and the optical components are mounted on the bottom member without the side member, enables the optical alignment of such optical components and the electrical wiring to be simple. Moreover, to provide the lead terminal in the package substrate prevents the deterioration of the high frequency performance of the module.

Such variations are not to be regarded as a departure from the spirit and scope of the invention, and all such modifications as would be obvious to one skilled in the art are intended for inclusion within the scope of the following claims.

What is claimed is:

1. An optical module comprising:
    an optical semiconductor device;
    a package accommodating the optical semiconductor device therein, said package including a bottom member and a side member; and
    at least a lead terminal,
    wherein said bottom member includes
        a device mounting surface for mounting said semiconductor device thereon,
        a side member mounting surface for surrounding the device mounting surface therearound,
        a lead forming surface for joining said at least a lead terminal thereto and for surrounding said side member mounting surface therearound,
        a package substrate having a first surface, a conductive wiring being formed thereon, and
        a wiring substrate having a first surface and a second surface, said first surface of said package substrate is provided with said wiring substrate thereon so that said first surface of said package substrate contacts said first surface of said wiring substrate, and
    wherein said first surface of said package substrate includes said lead forming surface and said second surface of said wiring substrate includes said device mounting surface.

2. The optical module according to claim 1, further includes a via hole provided in said wiring substrate, a conductive metal being plugged in said via hole to connect said first surface of said package substrate to said device mounting surface of said wiring substrate.

3. The optical module according to claim 1, further includes an insulating member having a first surface and a second surface, said first surface contacting to said first surface of said package substrate and said second surface including said side member mounting surface.

4. The optical module according to claim 1, wherein said wiring substrate is made of multi-layered AlN.

5. An optical module, comprising:

an optical semiconductor device;

a package for securing the optical semiconductor device therein; and at least a lead terminal, wherein the package has a side member and a bottom member comprising a wiring substrate for mounting the semiconductor device thereon and a package substrate for mounting the side member and the wiring substrate thereon, the lead terminal being attached to the package substrate, and a conductive wiring being formed on the package substrate to connect the lead terminal to the wiring substrate.

6. An optical module according to claim 5, wherein the wiring substrate has a via hole plugged by metal for connecting an upper surface of the wiring substrate to a bottom surface of the wiring substrate, the upper surface of the wiring substrate mounting the semiconductor device thereon and the bottom surface of the wiring substrate contacting the package substrate.

7. An optical module according to claim 5, wherein the bottom member further includes an insulating member disposed on the package substrate for mounting the side member so as to surround the wiring member.

8. An optical module according to claim 5, wherein the wiring substrate is made of multi-layered aluminum nitride.

9. An optical module according to claim 5, wherein the semiconductor device is a laser diode.

10. An optical module according to claim 5, wherein the semiconductor device is a photodiode.

11. An optical module according to claim 5, further includes a peripheral circuit for activating the semiconductor device, the wiring substrate of the bottom member mounting the peripheral circuit thereon.

12. An optical module according to claim 5, further comprises a lens and an optical fiber having a tip portion, the lens condensing light for optically coupling the semiconductor device to the tip portion of the optical fiber, wherein the device mounting surface of the wiring substrate mounts the lens thereon.

13. An optical module according to claim 5, wherein the side member has a bore and a holder for holding a ferrule inserting the tip portion of the optical fiber thereinto, the semiconductor device being coupled to the tip portion of the optical fiber through the bore.

14. A light emitting module, comprising:

a semiconductor light-emitting device for emitting light;

a peripheral circuit for driving the semiconductor light-emitting device;

a lens for condensing light emitted from the semiconductor light-emitting device;

a package for securing the semiconductor light-emitting device, the peripheral circuit and the lens; and at least a lead terminal, wherein the package has a side member and a bottom member comprising a wiring substrate for mounting the semiconductor light-emitting device, the peripheral circuit and the lens thereon and a package substrate for mounting the side member and the wiring substrate, the lead terminal being attached to the package substrate, and a conductive wiring being formed on the package substrate to connect the lead terminal to the wiring substrate.

15. A light emitting module according to claim 14, wherein the side member has a bore and a holder for holding a ferrule inserting the tip portion of an optical fiber thereinto, the semiconductor device being coupled to the tip portion of the optical fiber through the bore.

16. A light emitting module according to claim 14, wherein the wiring substrate has a via hole plugged by metal for connecting an upper surface of the wiring substrate to a bottom surface of the wiring substrate, the upper surface of the wiring substrate mounting the semiconductor light-emitting device, the peripheral circuit and the lens thereon, and the bottom surface of the wiring substrate contacting to the package substrate.

17. A light emitting module according to claim 14, wherein the bottom member further includes an insulating member disposed on the package substrate for mounting the side member so as to surround the wiring member.

* * * * *